United States Patent [19]

Motley et al.

[11] Patent Number: 5,581,197

[45] Date of Patent: Dec. 3, 1996

[54] METHOD OF PROGRAMMING A DESIRED SOURCE RESISTANCE FOR A DRIVER STAGE

[75] Inventors: Gordon W. Motley; David S. Maitland; Peter J. Meier, all of Ft. Collins, Colo.

[73] Assignee: Hewlett-Packard Co., Palo Alto, Calif.

[21] Appl. No.: 455,473

[22] Filed: May 31, 1995

[51] Int. Cl.$^6$ .................... H03K 19/0948; H03K 17/14; H03K 19/003

[52] U.S. Cl. .................. 326/30; 326/86; 326/33; 326/34

[58] Field of Search ................... 326/30, 31–34, 326/83, 86, 112, 119, 121; 327/538, 541, 543

[56] References Cited

U.S. PATENT DOCUMENTS

| | | | |
|---|---|---|---|
| 4,719,369 | 1/1988 | Asano et al. | 326/30 |
| 5,081,380 | 1/1992 | Chen | 327/541 |
| 5,124,580 | 6/1992 | Matthews et al. | 326/34 |
| 5,235,222 | 8/1993 | Kondoh et al. | 326/30 |

Primary Examiner—Edward P. Westin
Assistant Examiner—Jon Santamauro
Attorney, Agent, or Firm—Edward L. Miller

[57] ABSTRACT

The output impedance in a CMOS output driver stage is programmed and compensated by complementary current mirrors that are MOS devices in series with each of the conventional pull-up and pull-down devices. The conduction of these additional complementary devices is controlled according to complementary programming signals that are compensated for variations in manufacturing process parameters as well as for changes in temperature. A P-type programming signal may be referenced to +VDD and be produced from an N-type programming signal referenced to GND by the action of a gate voltage mirror that includes symmetrical N-type and P-type FET's in series. The N-type programming signal may be produced in the first instance from the gate voltage of an N-type FET used in a feedback loop that servos an external programming voltage to track an internally generated reference voltage. That gate voltage exhibits variations that reflect differences attributable to both process variations and to temperature. Those exhibited variations are communicated by a current mirror to a gate voltage mirror that produces the complementary programming signals, and which themselves constitute negative feedback. The complementary current mirrors are of known of gain, which in conjunction with knowing the value of VDD, allows the determination in advance of a definite table of programming resistance values versus output impedances.

2 Claims, 1 Drawing Sheet

METHOD OF PROGRAMMING A DESIRED SOURCE RESISTANCE FOR A DRIVER STAGE

BACKGROUND OF THE INVENTION

The designer of an output stage for a CMOS integrated circuit frequently chooses circuit parameters and device geometries that reflect the most pessimistic combination of manufacturing process variations and operating temperatures that are likely to be encountered. In systems that operate at high speeds and with low values of VDD, it is common for output stages to drive transmission lines that are capacitively terminated to produce a doubling of voltage. This scheme requires that the output impedance of the driver match the characteristic impedance of the transmission line, both when it is pulling up to VDD and pulling down to GND or to Dirty GND (DGND). If it does not, then possible undesirable side effects include increased rise times, overshoot and ringing. Overvoltage conditions and excessive power dissipation in the pull down device are possible associated outcomes, not to mention reduced density for the IC owing to the fabrication of devices larger than would otherwise be necessary. Unfortunately, however, the variations in IC manufacturing processes and in ambient operating temperature can combine to produce changes in output driver stage output impedance that can be several-fold to one. This situation limits system performance and increases costs. It would be desirable if the output impedance of a CMOS output driver stage could be externally programmed over a wide range of values after the IC was manufactured, irrespective of any variations in the processing parameters that produced the IC. It would be further desirable if would-be variations in the output impedance arising from changes in temperature were automatically compensated. Lastly, it should not be necessary to experiment with any particular IC to determine what programming value to use to produce the desired output impedance. Any IC of a particular type should program to that desired output impedance with a programming value known in advance, regardless of any manufacturing process variations that may be associated with specific individual IC's of that particular type.

SUMMARY OF THE INVENTION

A solution to the problem of output impedance variation in a CMOS output driver stage is to place an MOS device of appropriate polarity in series with each of the pull-up and pull-down devices, and to control the conduction of these additional devices according to programming signals that are compensated for variations in manufacturing process parameters, as well as compensated for changes in temperature. These additional devices constitute complementary output current mirrors whose respective programming signals are complementary, just as are the pull-up and pull=down devices they are in series with. A P-type programming signal may be referenced to +VDD and be produced from an N-type programming signal, referenced to GND, by the action of a gate voltage mirror that includes symmetrical N-type and P-type FET's in series. The N-type programming signal may be produced in the first instance from the gate voltage of an N-type FET used in a feedback loop that servos an external programming voltage to track an internally generated reference voltage. The external programming voltage arises according to the voltage drop across an external programming resistor according to the amount of current drawn through the resistor by the N-type FET in the feedback loop. This FET is also part of a current mirror that replicates the programming current in the gate voltage mirror. However, since the gate of the N-type FET connected to the programming resistor is in the feedback loop, but is not at the summing junction, it exhibits sizable variations that reflect differences attributable to both process variations and to temperature. Those exhibited variations are communicated into the gate voltage mirror in a logical sense that constitutes negative feedback. Hence the compensation. The complementary current mirrors mentioned above are not one to one, but instead have a known amount of gain. That, in conjunction with knowing the value of VDD, allows the determination in advance of a definite table of programming resistance values versus output impedances. The gain also allows the current through the external programming resistor to be small.

DESCRIPTION OF A PREFERRED EMBODIMENT

Figure 1:
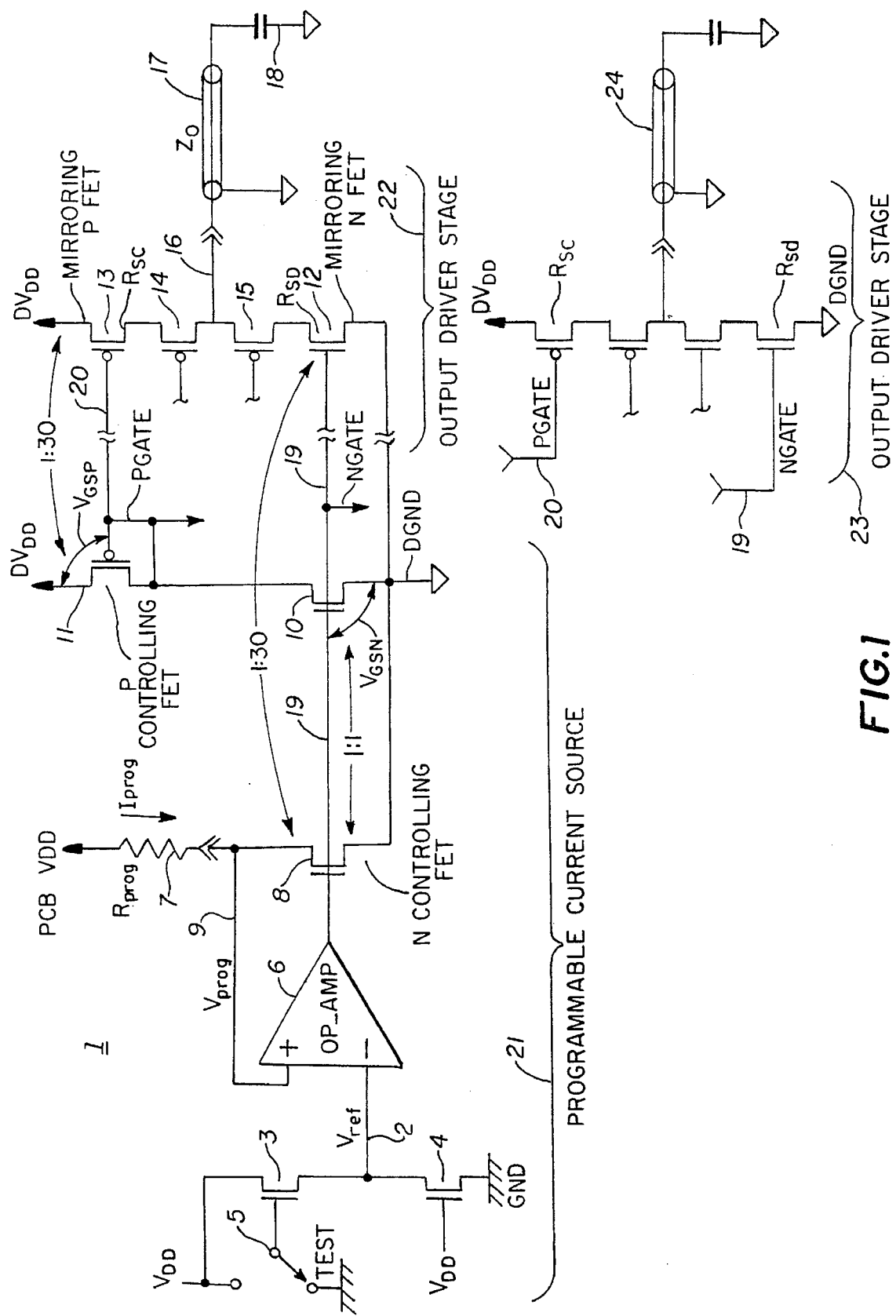
FIG. 1 is a simplified schematic diagram of an externally programmable CMOS output stage constructed in accordance with the principles of the invention.

Refer now to FIG. 1, wherein is shown a simplified schematic 1 of a compensating externally programmable CMOS output driver. The figure shows one programmable current source 21 and two output driver stages 22 and 23. As the explanation proceeds it will be appreciated that one programmable current source serves to set, and also maintain through compensation, the drive level (source impedance) of an arbitrary plurality of output driver stages; e.g., for an entire bus. It will further be appreciated that there could easily be multiple arbitrary pluralities of output driver stages, with each such multiple having a source impedance that is independently controlled by an associated separate programmable current source.

In the present preferred embodiment the CMOS output stages 22 and 23 drive capacitively terminated transmission lines 17 and 24, respectively. The transmission lines have a characteristic impedance of $Z_o$. Programmable current source 21 determines a composite source impedance for the CMOS output driver stages. That composite source impedance can be separated into a value $R_{sc}$ (the source resistance while charging) and a value $R_{sd}$ (the source resistance while discharging). Generally speaking, it is desirable that $R_{sc}$ and $R_{sd}$ be equal to each other and to the characteristic impedance $Z_o$ of the transmission line, although one can imagine that there might be special circumstances that would require them to be different.

Note the capacitive load 18 at the other end of transmission line 17. The present embodiment employs the well understood technique of doubling the output voltage by using reflected power from the reactive (and non power dissipative) discontinuity (capacitive load 18) at the terminus of the transmission line 17. It is the desire to achieve the full doubling, but without added overshoot ($Z_o$ too low plus the evil of multiple reflections) or excessive rise time ($Z_o$ too high and the attendant multiple reflections), that leads to extra concern about the source impedance of the output driver stages 22 and 23. Note that when the load is reactive, the power that is launched by charging through $R_{sc}$ is: transmitted out through $Z_o$, reflected (and the voltage at the load is doubled); transmitted back through $Z_o$; and is then absorbed by discharging, without re-reflection, by a still on $R_{sc}$. A similar sequence of events occurs for discharging involving $R_{sd}$. (All provided, of course, that $R_{sc}=Z_o=R_{sd}$). Yet even in a situation where there is a resistive termination with the expectation of genuine power transfer to the load without reflection, it is still important to control the source impedance of the output driver stages. In either case, the source impedance of the CMOS output driver stages can be controlled as described below.

To appreciate the operation of the CMOS output driver stages, consider just output driver stage 22, which includes four CMOS devices 12–15 in series. Devices 14 and 15 act as switches to respectively pull up (charge to DVDD) and pull down (discharge to DGND) on the output terminal 16 that drives the transmission line 17 whose $Z_o$ is to be matched by $R_{sc}$ (during pull-up) and by $R_{sd}$ (during pull-down). It will be understood that switching devices 14 and 15 are driven on and off in suitable alternation in accordance with the desired output waveform (which represents the bit pattern of the dam being output), and that although both devices 14 and 15 may be off to tri-state output terminal 16, both devices will never be on at the same time. Device 13 acts as a resistance of programmable value to combine with the very low on resistance of device 14 to produce $R_{sc}$. Similarly, device 12 acts as a resistance of programmable value to combine with the relatively low on resistance of device 15 to produce $R_{sd}$. The resistance of device 13 is controlled by the value of the voltage PGATE 20, while in similar fashion the resistance of device 12 is determined by the value of the voltage NGATE 19. Assuming now that the P-type device 13 and N-type device 12 have generally equal transconductance, what is needed is a way to produce signals NGATE 19 and PGATE 20 that (1) can be externally varied to adjust $R_{sc}$ and $R_{sd}$ over a suitably wide range of $Z_o$ despite process variations; (2) vary together such that as NGATE increases from DGND toward DVDD, PGATE decreases correspondingly from DVDD toward DGND; and (3) automatically adjust to compensate for the effects of temperature. These objective are accomplished by a compensated reference voltage operating in conjunction with two current mirrors and a voltage translator (gate voltage mirror), as now described below.

To begin this portion of the explanation, a voltage $V_{ref}2$ is derived from VDD by a voltage divider including two N-type FET's 3 and 4 that are in series between VDD and GND. The geometry of these two devices is chosen to produce, for a VDD of say, 3.3 V, a $V_{ref}$ of 1.8 V. Owing to their similarities in construction, devices 3 and 4 produce a voltage divider whose output is nearly constant over a reasonably wide range of temperature and process variations. Owing to their operational characteristics as individual FET's, they even tend to suppress variations in $V_{ref}$ due to minor changes in the value of VDD. Thus, $V_{ref}$ is a generally stable reference voltage generated internally on the IC. Meanwhile, an external programming resistor $R_{prog}$ 7 is connected between and external source of VDD and a terminal 9 of the CMOS IC. Terminal 9 is called $V_{prog}$. The voltage at $V_{prog}$ is produce by a feedback controlled voltage divider formed by the external programming resistor $R_{prog}$ 7 and an N-type device 8 called the N-CONTROLLING FET, whose other end is connected to DGND. $V_{prog}$ and $V_{ref}$ are applied to an error amplifier 6 (an operational amplifier of suitable gain) whose output is the signal NGATE 19. NGATE is applied to the gate of the N-CONTROLLING FET 8. The result of this circuit arrangement is now discussed below.

First, $V_{prog}$ equals $V_{ref}$, within the error limits of the feedback loop. A gain of forty in the error amplifier 6 is a reasonable gain and will keep $V_{prog}$ 9 within, say, 50 mv of $V_{ref}$. Second, the characteristics of device 8 are included in the feedback loop. This means that the gate voltage $V_{GSN}$ (which is also NGATE 19) varies as needed to null variations in $V_{prog}$ that are due parameter shifts in device 8 arising from temperature and process variations. Thus, NGATE varies in a way that can be used to supply compensation to other devices that experience generally identical parameter shifts for those same process and temperature excursions.

So, for example, if device 8 is considered "fast" (i.e., the current through the device is relatively large for a given $V_{GSN}$) compared to a hypothetical design center device, the voltage Vprog will tend to be lower than it would other wise be (which is set at $V_{ref}$ by the feedback loop). (Presumably, devices 12 and 13 will also be "fast", which causes them to exhibit decreased values for $R_{sc}$ and $R_{sd}$, which is bad news.) However, if $V_{prog}$ decreases below $V_{ref}$, the error amplifier will decrease the value of NGATE and raise the resistance of device 8 to increase $V_{prog}$ back to near $V_{ref}$. As will be seen, decreasing the value of NGATE increases the resistance of devices 12 and 13. This is what is wanted, since they are also "fast", having been fabricated in the same process, and would otherwise then presumably operate with a resistance lower than desired. Similar examples obtain for "slow" devices, as well as for shifts produced by temperature excursions.

The point of the example in the preceding paragraph is that, by including device 8 in the feedback loop for $V_{ref}$, variations in NGATE are produced that can be used for compensation of deviation away from a programmed value of source impedance owing to process and temperature variations. Compensation is not to be confused with setting the value of the source impedance of the output driver stage in the first place. That is done by choosing a value for $R_{prog}$.

To continue the explanation, consider now the operation of n-channel FET 10 and p-channel FET 11. Devices 8 and 10 comprise a 1:1 current mirror. Device 10 is operated in a region where it tends to behave as a constant current source, where the value of the current is a function of $V_{GSN}$ (i.e., of NGATE). That is, the current through device 10 (and 11, too) will be $I_{prog}$, but as adjusted (for compensation) by any movement in $V_{GSN}$ produced by the error amplifier 6 as it servos $V_{prog}$ to track $V_{ref}$. Device 11 also operates in a constant current region, and owing to symmetry of construction, it will have the same magnitude gate voltage at a given current as does device 10. Since devices 10 and 11 are connected in series, as constant current sources they produce and share exactly the same current. Thus, the current through device 10 produces, or is accompanied by, gate voltage $V_{GSP}$ (PGATE) for device 11 that, when referenced to DVDD, corresponds in magnitude and direction of change to $V_{GSN}$ referenced to DGND. We could say that devices 10 and 11 amount to a gate voltage mirror. The results are signals NGATE 19 and PGATE 20 whose values are determined in a major fashion according to the value selected for $R_{prog}$ and that vary in a minor fashion according to variations in process and temperature.

At this point we return to a consideration of the output current drivers 22 and 23. Note that the signal NGATE 19 drives the gate of the n-channel FET 12, while the signal PGATE 20 drives the gate of the p-channel FET 13. Now note that devices 8 and 12 also constitute a current mirror. Because of the geometries selected for FET 12 it is a 1:30 mirror, so that current that flows through FET 12 (when allowed by device 15 being on) is thirty times the amount of current flowing through device 8 ($I_{prog}$). It will also be appreciated that, through the intervening action of the gate voltage mirror (devices 10 and 11), devices 8 and 13 also constitute a (1:30) current mirror. Hence, $R_{prog}$ sets $I_{prog}$, which in turn programs and also compensates the values of $R_{sc}$ for device 13 and $R_{sd}$ for device 12.

Next, it should be noted that it is not necessary to experimentally select $R_{prog}$ for each batch of IC's made with varying processes. In fact, for the present embodiment $R_{prog}$ has a definite predetermined relationship with $R_{sc}$ and $R_{sd}$. To appreciate this, first note that $I_{prog}=(VDD-V_{prog})/R_{prog}$, and that (the current in or out of $Z_o$) $I_{drive}=GAIN * I_{prog}$. Now, it is useful and practical to arrange that $VDD-V_{prog}=VDD/2$. Now consider, say $R_{sc}$. When $R_{sc}$ is driving and equal to $Z_o$, the result is a voltage divider that produces VDD/2 at their junction. Since R=E/I, $R_{sc}$ must be VDD/2 divided by the expression $GAIN * ((VDD-V_{prog})/R_{prog})$. Since $VDD-V_{prog}$ is VDD/2, the result simplifies to $R_{sc}=R_{prog}/GAIN$. An identical demonstration works for $R_{sd}$.

Finally, it may be desirable to equip the reference divider of devices 3 and 4 with a switch 5 that disconnects the gate of device 3 from VDD and connects it instead to GND. This turns device 3 off, while leaving device 4 on. As a result, $V_{ref}$ goes to zero, NGATE goes close to DGND and PGATE goes close to DVDD. That turns devices 12 and 13 off to cooperate with a static current check for the IC.

It will be appreciated in light of the foregoing teachings that the output or source resistance of other circuits may be set, and if desired, compensated, in ways that are in accordance with the basic principles of those teachings. For example, consider a single ended output stage having a pull up resistor and one or more pull down drivers. Each driver device could have its own programmed controlling device in series, or there could be one programmed controlling device in common for all driver devices. The devices need not be FET's: bi-polar devices would work as well. The use of a transmission line is not required, and if the circuitry is part of an integrated circuit, the source resistance being controlled need not be one that drives a pin that goes off the chip. And in that connection, the adjustable series resistance of a controlling device in series with a switching device could be constructed in discrete form, say, as a circuit on a printed circuit assembly instead of as part of an integrated circuit. It will further be observed that the compensation arises by incorporating, into a feedback loop that nulls the difference between a programming signal and a reference, a device having performance characteristics that depend upon temperature and manufacturing processes. By making the controlling device that is in series with the driver device have generally those same performance characteristics, variations in the error signal of the feedback amplifier also provide automatic compensation for variation owing to process and temperature variations. At the same time, if the programming signal is adjustable it causes a corresponding steady state variation in the error signal, which serves to program the value of the output resistance of the output circuit. And although we have shown one particular way of doing this, where the programming signal is obtained from the current $I_{prog}$ through a resistor $R_{prog}$ into a summing junction, and the amplified error signal both servos the current $I_{prog}$ and drives a current mirror to set the drive level $I_{drive}$ of the controlling device, it will be appreciated that common performance characteristics could be located within the interior of the error amplifier.

We claim:

1. A method of programming a desired source resistance for a driver stage having an output, the method comprising the steps of:

(a) driving a first switching transistor on and off in accordance with a data pattern that is to appear at the output;

(b) driving a first controlling transistor that is in series with the first switching transistor with a first drive signal selected to cause the first controlling transistor to resist the flow of current therethrough by an amount equal to the desired source resistance;

(c) driving a second switching transistor, of polarity opposite that of the first switching transistor, on and off in accordance with the complement of the data pattern that is to appear at the output;

(d) driving a second controlling transistor, of polarity opposite that of the first controlling transistor and in series with the second switching transistor, with a second drive signal selected to cause the second controlling transistor to resist the flow of current therethrough by an amount equal to the desired source resistance;

(e) nulling with a feedback amplifier the difference between a programming signal originating in an external environment and a reference signal; and (f) deriving the first and second drive signals from an error signal of the feedback amplifier.

2. A method as in claim 1 further comprising the step of including in the gain path of the feedback amplifier a transistor having performance dependencies upon manufacturing processes and temperature that are generally the same as those for the first and second controlling transistors.

\* \* \* \* \*